United States Patent
Chang et al.

(10) Patent No.: US 9,729,074 B2
(45) Date of Patent: Aug. 8, 2017

(54) MULTIFUNCTIONAL SIGNAL ISOLATION CONVERTER

(71) Applicant: FINETEK Co., Ltd., New Taipei (TW)

(72) Inventors: Liang-Chi Chang, New Taipei (TW); Jen-Shun Wang, New Taipei (TW); Chi-Fan Liao, New Taipei (TW); Yi-Liang Hou, New Taipei (TW)

(73) Assignee: FINETEK CO., LTD., New Taipei (TW)

( * ) Notice: Subject to any disclaimer, the term of this patent is extended or adjusted under 35 U.S.C. 154(b) by 348 days.

(21) Appl. No.: 14/569,027

(22) Filed: Dec. 12, 2014

(65) Prior Publication Data

US 2016/0172994 A1     Jun. 16, 2016

(51) Int. Cl.
| | |
|---|---|
| *H02H 3/00* | (2006.01) |
| *H02M 7/00* | (2006.01) |
| *G05B 15/02* | (2006.01) |
| *G05F 1/00* | (2006.01) |
| *H02M 1/32* | (2007.01) |
| *H02H 7/10* | (2006.01) |
| *H02H 7/085* | (2006.01) |

(52) U.S. Cl.
CPC .............. *H02M 7/00* (2013.01); *G05B 15/02* (2013.01); *G05F 1/00* (2013.01); *H02H 7/085* (2013.01); *H02H 7/10* (2013.01); *H02M 2001/327* (2013.01)

(58) Field of Classification Search
USPC ................................................ 361/18, 86–87
See application file for complete search history.

(56) References Cited

U.S. PATENT DOCUMENTS

| | | | | |
|---|---|---|---|---|
| 5,552,952 | A * | 9/1996 | Kramer ................ | H02H 7/1255 361/47 |
| 2011/0301772 | A1* | 12/2011 | Zuercher ........... | H01L 31/02021 700/293 |
| 2014/0092655 | A1* | 4/2014 | Igarashi .................. | B60L 3/003 363/56.03 |
| 2015/0085539 | A1* | 3/2015 | Ueda ........................ | H02H 5/04 363/56.01 |

\* cited by examiner

*Primary Examiner* — Danny Nguyen
(74) *Attorney, Agent, or Firm* — Muncy, Geissler, Olds & Lowe, P.C.

(57) ABSTRACT

A multifunctional signal isolation converter (10) is arranged in a safe area (20), and is applied to an electronic apparatus (40) arranged in a dangerous area (30). The multifunctional signal isolation converter (10) includes a microprocessor (108) and a power supply unit (116). The microprocessor (108) determines whether internal functions of the multifunctional signal isolation converter (10) are normal or not to obtain a first judgment value. The electronic apparatus (40) sends an input signal (42) to the microprocessor (108). The microprocessor (108) determines whether functions of the electronic apparatus (40) are normal or not to obtain a second judgment value according to the input signal (42). The microprocessor (108) controls whether the power supply unit (116) supplies a driving power (122) to the electronic apparatus (40) or not according to the first judgment value and the second judgment value.

9 Claims, 6 Drawing Sheets

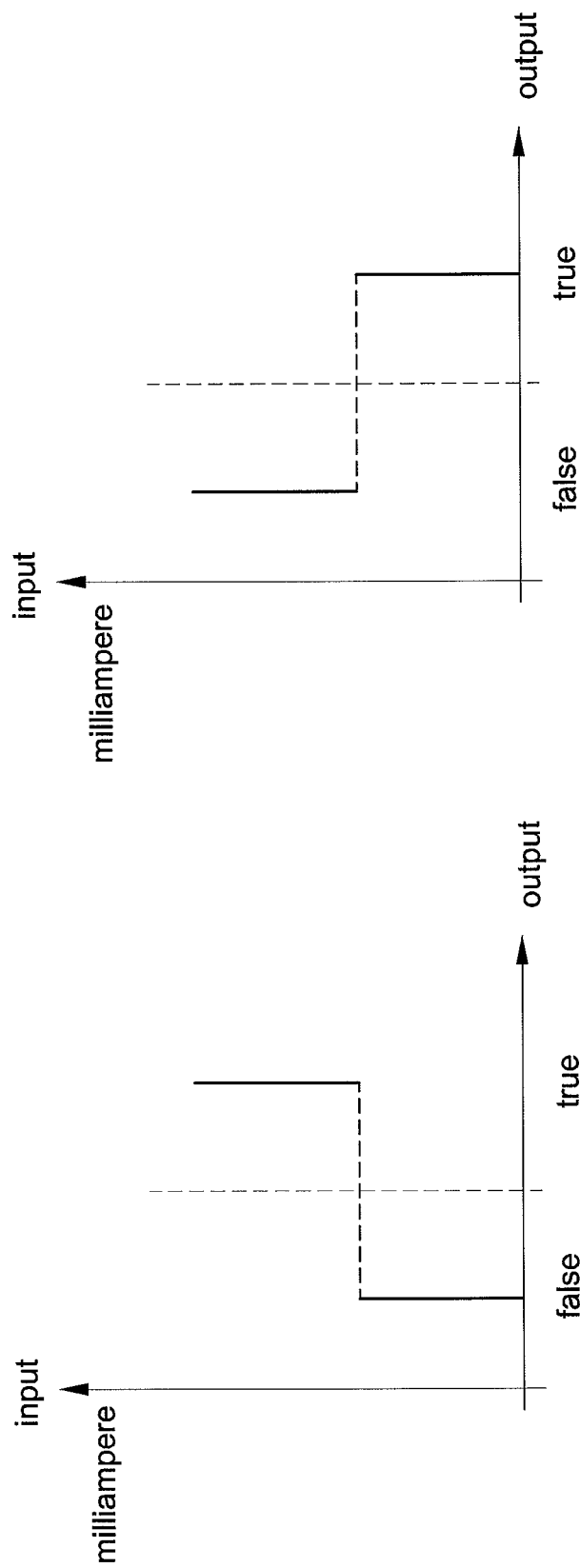

MULTIFUNCTIONAL SIGNAL ISOLATION CONVERTER

BACKGROUND OF THE INVENTION

Field of the Invention

The present invention relates to a signal isolation converter, and especially relates to a multifunctional signal isolation converter.

Description of the Related Art

IEC 60079 and IEC 80079 are standards for explosion-proof electrical products and are set by the International Electrotechnical Commission (IEC). A related art signal isolation converter fetches electrical signals (for examples, 0~20 mA, 4~20 mA, 0~5 volts and 0~10 volts) which are used widely in industrial sensors. Then, the related art signal isolation converter converts the electrical signals mentioned above to output signals (for examples, 0~25 mA and −10~10 Vdc).

Therefore, the related art signal isolation converter is very important. However, high cost and low efficiency are the disadvantages of the related art signal isolation converter.

SUMMARY OF THE INVENTION

In order to solve the above-mentioned problems, an object of the present invention is to provide a multifunctional signal isolation converter.

In order to achieve the object of the present invention mentioned above, the multifunctional signal isolation converter is arranged in a safe area. The multifunctional signal isolation converter is applied to an electronic apparatus which is arranged in a dangerous area. The multifunctional signal isolation converter comprises a signal input terminal, a microprocessor and a power supply unit. The signal input terminal is electrically connected to the electronic apparatus. The microprocessor is electrically connected to the signal input terminal. The power supply unit is electrically connected to the microprocessor and the electronic apparatus. The power supply unit provides a driving power. The microprocessor is configured to determine whether internal functions of the multifunctional signal isolation converter are normal or not to obtain a first judgment value. The electronic apparatus sends an input signal to the microprocessor through the signal input terminal. The microprocessor is configured to determine whether functions of the electronic apparatus are normal or not to obtain a second judgment value according to the input signal. The microprocessor is configured to control whether the power supply unit supplies the driving power to the electronic apparatus or not according to the first judgment value and the second judgment value.

The advantages of the present invention are to provide the multifunctional signal isolation converter with low cost and high efficiency.

BRIEF DESCRIPTION OF DRAWING

FIG. 2 shows the first embodiment of the conversions between the analog input signals and the input-output (I/O) pin signals of the present invention.

FIG. 3 shows the second embodiment of the conversions between the analog input signals and the input-output (I/O) pin signals of the present invention.

DETAILED DESCRIPTION OF THE INVENTION

Please refer to following detailed description and figures for the technical content of the present invention. The following detailed description and figures are referred for the present invention, but the present invention is not limited to it.

Figure 1:
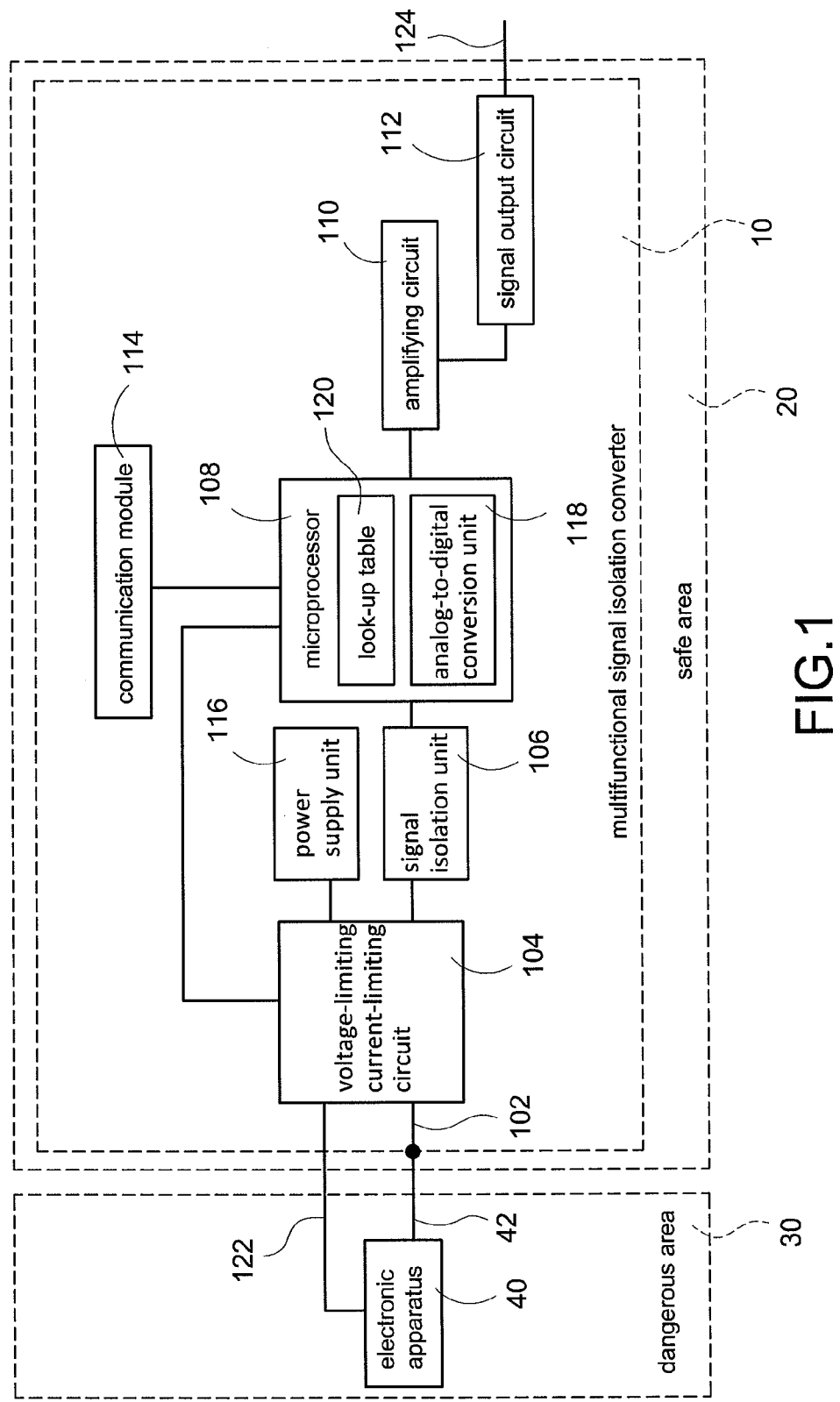
FIG. 1 shows a block diagram of the multifunctional signal isolation converter of the present invention.

FIG. 1 shows a block diagram of the multifunctional signal isolation converter of the present invention. A multifunctional signal isolation converter 10 is arranged in a safe area 20 (namely, a first area). The multifunctional signal isolation converter 10 is applied to an electronic apparatus 40 which is arranged in a dangerous area 30 (namely, a second area).

The multifunctional signal isolation converter 10 comprises a signal input terminal 102, a voltage-limiting current-limiting circuit 104, a signal isolation unit 106, a microprocessor 108, an amplifying circuit 110, a signal output circuit 112, a communication module 114 and a power supply unit 116. The microprocessor 108 comprises an analog-to-digital conversion unit 118 and a look-up table 120.

The signal input terminal 102 is electrically connected to the electronic apparatus 40. The voltage-limiting current-limiting circuit 104 is electrically connected to the microprocessor 108, the signal input terminal 102, the signal isolation unit 106, the power supply unit 116 and the electronic apparatus 40. The signal isolation unit 106 is electrically connected to the microprocessor 108 and the signal input terminal 102. The microprocessor 108 is electrically connected to the signal input terminal 102. The amplifying circuit 110 is electrically connected to the microprocessor 108 and the signal output circuit 112. The signal output circuit 112 is electrically connected to the microprocessor 108. The communication module 114 is electrically connected to the microprocessor 108. The power supply unit 116 is electrically connected to the microprocessor 108 and the electronic apparatus 40.

The power supply unit 116 provides a driving power 122. The microprocessor 108 is configured to determine whether internal functions of the multifunctional signal isolation converter 10 are normal or not to obtain a first judgment value. The electronic apparatus 40 sends an input signal 42 to the microprocessor 108 through the signal input terminal 102. The microprocessor 108 is configured to determine whether functions of the electronic apparatus 40 are normal or not to obtain a second judgment value according to the input signal 42. The microprocessor 108 is configured to control whether the power supply unit 116 supplies the driving power 122 to the electronic apparatus 40 or not according to the first judgment value and the second judgment value.

The signal isolation unit 106 receives the input signal 42 and then the signal isolation unit 106 informs the microprocessor 108 of the input signal 42 in isolation to protect the microprocessor 108. The signal isolation unit 106 is, for examples but not limited to, an electromagnetic signal isolator, a capacitive signal isolator or an inductive signal isolator.

The signal output circuit 112 comprises a relay (not shown in FIG. 1). The microprocessor 108 outputs an output signal 124 through the signal output circuit 112 and the amplifying circuit 110. The analog-to-digital conversion unit 118 converts the input signal 42 into a digital signal.

The internal functions of the multifunctional signal isolation converter 10 determined by the microprocessor 108 comprise: whether an internal voltage of the multifunctional signal isolation converter 10 is complied with a standard voltage or not, whether communications (for examples, SPI, I2C, UART) between the microprocessor 108 and internal components of the multifunctional signal isolation converter 10 are normal or not, and whether an internal temperature of the multifunctional signal isolation converter 10 is complied with a standard temperature or not.

The first judgment value is determined as "1" if the internal voltage of the multifunctional signal isolation converter 10 is complied with the standard voltage. The first judgment value is determined as "0" if the internal voltage of the multifunctional signal isolation converter 10 is not complied with the standard voltage. The first judgment value is determined as "1" if the communications between the microprocessor 108 and the internal components of the multifunctional signal isolation converter 10 are normal. The first judgment value is determined as "0" if the communications between the microprocessor 108 and the internal components of the multifunctional signal isolation converter 10 are not normal. The first judgment value is determined as "1" if the internal temperature of the multifunctional signal isolation converter 10 is complied with the standard temperature. The first judgment value is determined as "0" if the internal temperature of the multifunctional signal isolation converter 10 is not complied with the standard temperature.

The functions of the electronic apparatus 40 determined by the microprocessor 108 comprise:

1. Detecting a connection between the multifunctional signal isolation converter 10 and the electronic apparatus 40: Detects whether a current of the input signal 42 is larger than zero or not. Normally, the current of the input signal 42 is about 4~20 mA. Therefore, the second judgment value is determined as "1" if the current of the input signal 42 is greater than zero (namely, the multifunctional signal isolation converter 10 is connected to the electronic apparatus 40). The second judgment value is determined as "0" if the current of the input signal 42 is equal to zero (namely, the multifunctional signal isolation converter 10 is not connected to the electronic apparatus 40).

2. Whether the current of the input signal 42 is complied with a standard current or not:
  (a) If the standard current is 4~20 mA: The second judgment value is determined as "0" if the current of the input signal 42 is less than 3.8 mA or is greater than 20.5 mA. The second judgment value is determined as "1" if the current of the input signal 42 is not less than 3.8 mA and is not greater than 20.5 mA.

(b) If the standard current is 8/16 mA (namely, 8 mA or 16 mA): The second judgment value is determined as "0" if the current of the input signal 42 is not within 8/16 mA+−10%. The second judgment value is determined as "1" if the current of the input signal 42 is within 8/16 mA+−10%.

The first judgment value and the second judgment value are, for example but not limited to, digital signal values. The microprocessor 108 is configured to control the power supply unit 116 not to send the driving power 122 to the electronic apparatus 40 when the first judgment value is not "1" or the second judgment value is not "1". The microprocessor 108 is configured to control the power supply unit 116 to send the driving power 122 to the electronic apparatus 40 when both of the first judgment value is "1" and the second judgment value is "1" (namely, similar to an "AND" gate).

The microprocessor 108 is configured to check the look-up table 120 to control whether the power supply unit 116 supplies the driving power 122 to the electronic apparatus 40 or not. The electronic apparatus 40 is, for example but not limited to, a sensor or an actuator. The sensor is used to measure physical quantity, for examples, temperature, pressure, liquid level and so on. The actuator is used to change physical quantity, for examples, a heater, a motor and so on. The multifunctional signal isolation converter 10 is used to turn on the actuator or turn off the actuator.

The communication module 114 is connected to an external RS-485 interface, an external RS-232 interface, an external highway addressable remote transducer (HART) interface, a ZigBee interface, a wireless HART interface or a GSM interface. The amplifying circuit 110 can increase the quantity of the input pin and the output pin of the microprocessor 108 to control an apparatus with larger voltage or current directly. The amplifying circuit 110 comprises a relay (not shown in FIG. 1).

Moreover, the multifunctional signal isolation converter 10 further comprises an analog signal input module (not shown in FIG. 1) and a digital signal input module (not shown in FIG. 1). The analog signal input module is electrically connected to the signal input terminal 102 and the voltage-limiting current-limiting circuit 104. The digital signal input module is electrically connected to the signal input terminal 102 and the voltage-limiting current-limiting circuit 104.

The analog signal input module is an analog signal input circuit for extension to measure analog signals besides 0~24 mA, for examples, 0~5 volts, 0~10 volts and so on. The digital signal input module is used with a smart sensor (the electronic apparatus 40) to communicate digital data with the smart sensor. The transmission specifications can be Modbus, HART, Profibus and so on, or a self-developed communication protocol.

FIG. 2 shows the first embodiment of the conversions between the analog input signals and the input-output (I/O) pin signals of the present invention. FIG. 3 shows the second embodiment of the conversions between the analog input signals and the input-output (I/O) pin signals of the present invention. The input-output (I/O) pin signals of the microprocessor 108 are "true" and "false". Namely, the microprocessor 108 is configured to adjust the input-output (I/O) pin signals according to FIG. 3 and FIG. 4 of the look-up table 120.

Please refer to FIG. 2. The input-output (I/O) pin signal is set as "High" when the analog input signal is greater than a predetermined value. The input-output (I/O) pin signal is set as "Low" when the analog input signal is not greater than the predetermined value. Please refer to FIG. 3. The input-output (I/O) pin signal is set as "High" when the analog input signal is less than the predetermined value. The input-output (I/O) pin signal is set as "Low" when the analog input signal is not less than the predetermined value. Therefore, the analog input signal is converted into the digital signal (High/Low). The microprocessor 108 can communicate with a PLC (programmable logic controller) directly. The microprocessor 108 can control the PLC through the amplifying circuit 110 directly as well.

Figure 4:
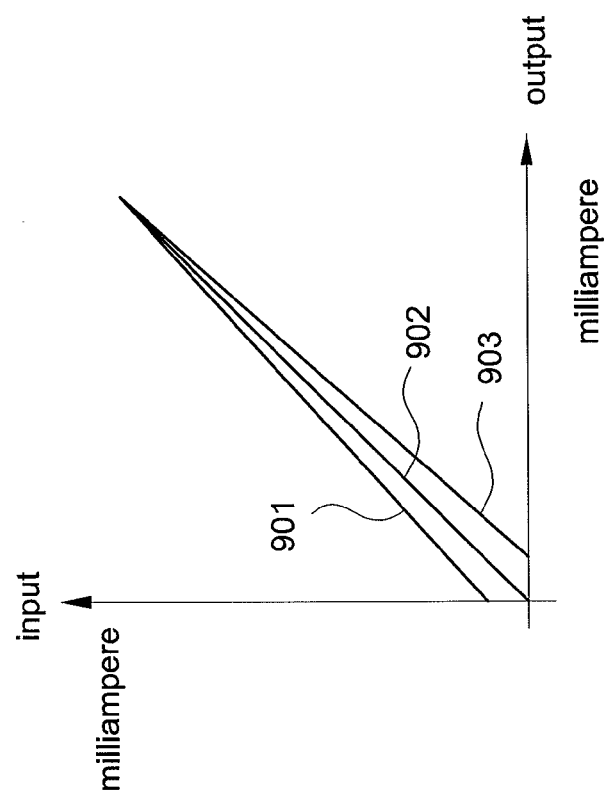
FIG. 4 shows the first embodiment of the conversions between the analog input signals and the output signals of the present invention.

FIG. 4 shows the first embodiment of the conversions between the analog input signals and the output signals of the present invention. The microprocessor 108 converts the analog input signal according to FIG. 4~FIG. 7 of the look-up table 120. FIG. 4 is a current conversion table. A curve 901 is a conversion curve for input 4~20 mA and output 0~20 mA. A curve 902 is a conversion curve for input 0~20 mA and output 0~20 mA. The curve 902 is a conversion curve for input 4~20 mA and output 4~20 mA as well. A curve 903 is a conversion curve for input 0~20 mA and output 4~20 mA. The signals mentioned above are measured by the electronic apparatus 40 (sensor) directly, and are usually referred as "Level High" in the industrial application.

Figure 5:
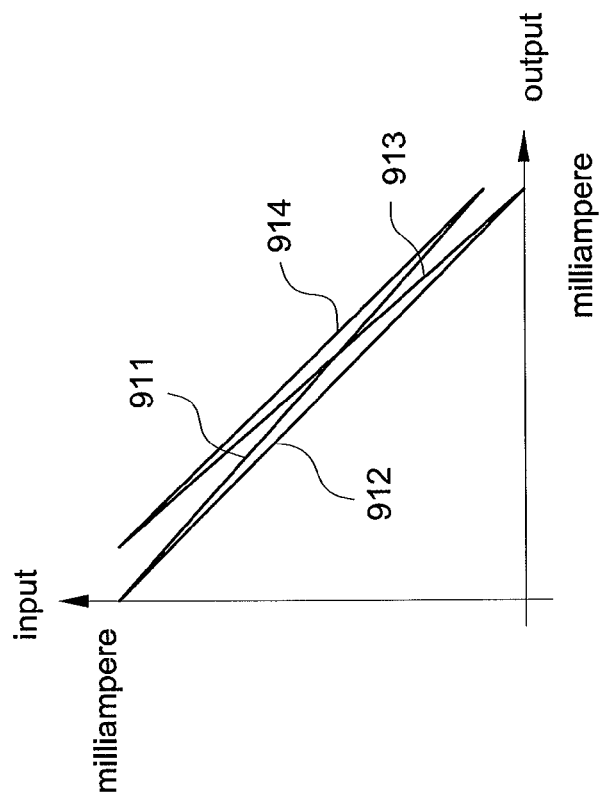
FIG. 5 shows the second embodiment of the conversions between the analog input signals and the output signals of the present invention.

FIG. 5 shows the second embodiment of the conversions between the analog input signals and the output signals of the present invention. A curve 911 is a conversion curve for input 4~20 mA and output 20~0 mA. A curve 912 is a conversion curve for input 0~20 mA and output 20~0 mA. A curve 913 is a conversion curve for input 0~20 mA and output 20~4 mA. A curve 914 is a conversion curve for input 4~20 mA and output 20~4 mA. The output signals shown in FIG. 5 are reverse to the output signals shown in FIG. 4. The signals mentioned above are usually referred as "Level Low" in the industrial application. The "Level High" and the "Level Low" can be converted into each other according to FIG. 4 and FIG. 5.

Figure 6:
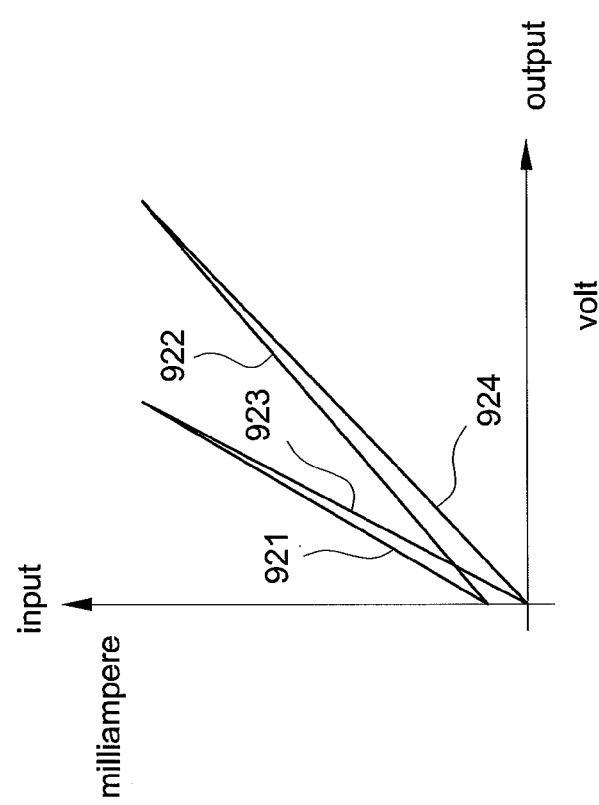
FIG. 6 shows the third embodiment of the conversions between the analog input signals and the output signals of the present invention.

FIG. 6 shows the third embodiment of the conversions between the analog input signals and the output signals of the present invention. A curve 921 is a conversion curve for input 4~20 mA and output 0~5 volts. A curve 922 is a conversion curve for input 4~20 mA and output 0~10 volts. A curve 923 is a conversion curve for input 0~20 mA and output 0~5 volts. A curve 924 is a conversion curve for input 0~20 mA and output 0~10 volts. The current signals can be converted into voltage signals in the industrial application according to FIG. 6.

Figure 7:
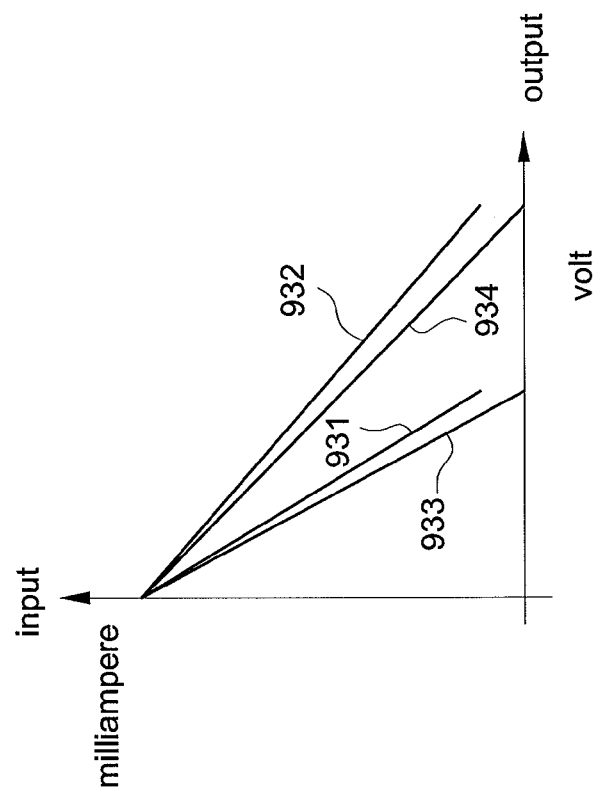
FIG. 7 shows the fourth embodiment of the conversions between the analog input signals and the output signals of the present invention.

FIG. 7 shows the fourth embodiment of the conversions between the analog input signals and the output signals of the present invention. A curve 931 is a conversion curve for input 4~20 mA and output 5~0 volts. A curve 932 is a conversion curve for input 4~20 mA and output 10~0 volts. A curve 933 is a conversion curve for input 0~20 mA and output 5~0 volts. A curve 934 is a conversion curve for input 0~20 mA and output 10~0 volts. Similar to FIG. 4 and FIG. 5, the level of material and the level of empty bucket can be converted to each other according to FIG. 6 and FIG. 7.

Figure 8:
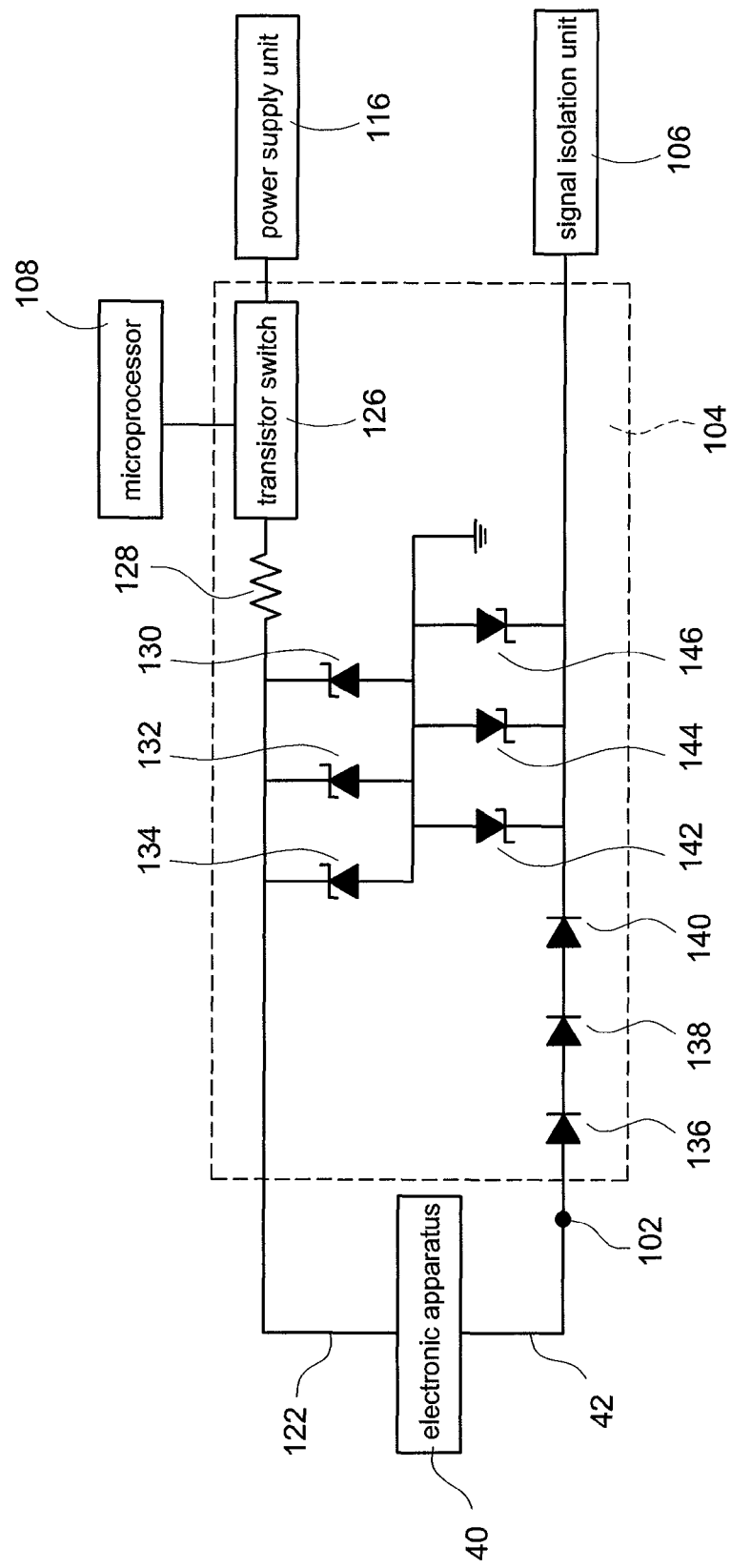
FIG. 8 shows a circuit diagram of the voltage-limiting current-limiting circuit of the present invention.

FIG. 8 shows a circuit diagram of the voltage-limiting current-limiting circuit of the present invention. The voltage-limiting current-limiting circuit 104 comprises a transistor switch 126, a current-limiting resistor 128, a first Zener diode 130, a second Zener diode 132, a third Zener diode 134, a first diode 136, a second diode 138, a third diode 140, a fourth Zener diode 142, a fifth Zener diode 144 and a sixth Zener diode 146.

The transistor switch 126 is electrically connected to the microprocessor 108 and the power supply unit 116. The current-limiting resistor 128 is electrically connected to the transistor switch 126 and the electronic apparatus 40. The first Zener diode 130 is electrically connected to the electronic apparatus 40 and the current-limiting resistor 128. The second Zener diode 132 is electrically connected to the electronic apparatus 40 and the current-limiting resistor 128. The third Zener diode 134 is electrically connected to the electronic apparatus 40 and the current-limiting resistor 128.

The first diode 136 is electrically connected to the signal input terminal 102. The second diode 138 is electrically connected to the first diode 136. The third diode 140 is electrically connected to the second diode 138 and the signal isolation unit 106. The fourth Zener diode 142 is electrically connected to the third diode 140 and the signal isolation unit 106. The fifth Zener diode 144 is electrically connected to the third diode 140 and the signal isolation unit 106. The sixth Zener diode 146 is electrically connected to the third diode 140 and the signal isolation unit 106.

The power supply unit 116 sends the driving power 122 to the electronic apparatus 40 when the microprocessor 108 turns on the transistor switch 126. The power supply unit 116 does not send the driving power 122 to the electronic apparatus 40 when the microprocessor 108 turns off the transistor switch 126.

Figure 9:
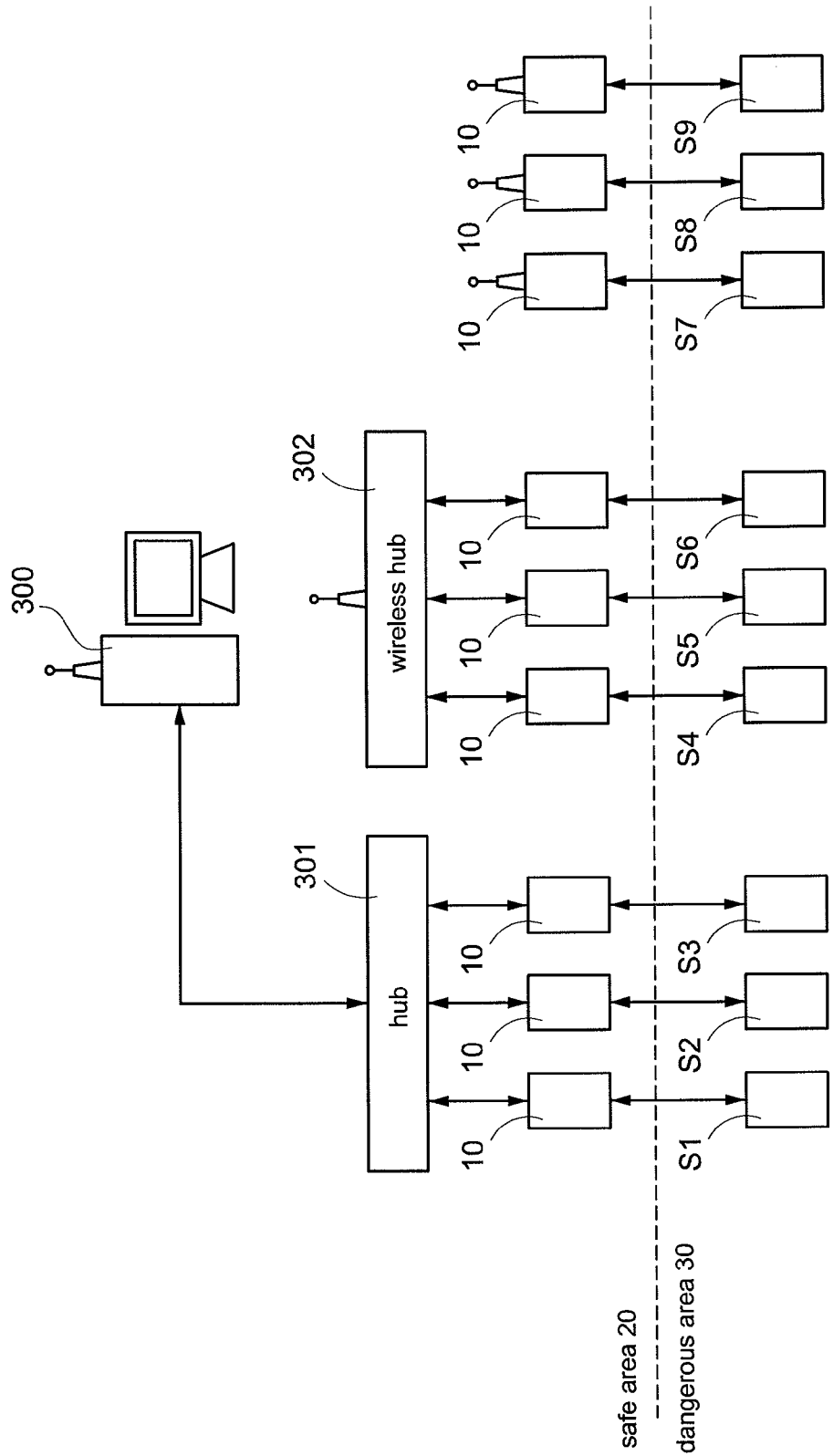
FIG. 9 shows an embodiment of the multifunctional signal isolation converter with digital communication functions of the present invention.

FIG. 9 shows an embodiment of the multifunctional signal isolation converter with digital communication functions of the present invention. There are three kinds of communication loops in FIG. 3:

1. The multifunctional signal isolation converters 10 are connected to a hub 301. The hub 301 is connected to an upper controller, for examples, a computer 300, a PLC (not shown in FIG. 9) or a supervisory control and data acquisition (SCADA, not shown in FIG. 9)

2. The multifunctional signal isolation converters 10 are connected to a wireless hub 302. The wireless hub 302 is wirelessly (for example, using ZigBee) connected to the computer 300.

3. The multifunctional signal isolation converters 10 are wirelessly (for example, using ZigBee) connected to the computer 300 directly.

Moreover, the communication loops (interfaces) between the computer 300, the hub 301 the wireless hub 302 and the multifunctional signal isolation converters 10 are, for examples, RS-485, RS-232, HART interface, wireless ZigBee, wireless Hart, GSM and so on. The communication loops (interfaces) between the multifunctional signal isolation converters 10 and the sensors S1~9 are, for examples, Modbus, HART, Profibus and so on.

The advantages of the present invention are to provide the multifunctional signal isolation converter with low cost and high efficiency. The multifunctional signal isolation converter 10 is complied with IEC 60079 and IEC 80079. The multifunctional signal isolation converter 10 fetches electrical signals (for examples, 0~20 mA, 4~20 mA, 0~5 volts and 0-10 volts) which are used widely in industrial sensors. Then, the multifunctional signal isolation converter 10 converts the electrical signals mentioned above to output the output signal 124 (for examples, 0~25 mA and −10~10 Vdc).

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A multifunctional signal isolation converter arranged in a safe area and applied to an electronic apparatus, the multifunctional signal isolation converter comprising:
   a signal input terminal electrically connected to the electronic apparatus;
   a microprocessor electrically connected to the signal input terminal; and
   a power supply unit electrically connected to the microprocessor and the electronic apparatus, the power supply unit providing a driving power; and
   a signal isolation unit electrically connected to the microprocessor and the signal input terminal,
   wherein the microprocessor is configured to determine whether internal functions of the multifunctional signal isolation converter are normal or not to obtain a first judgment value;
   wherein the electronic apparatus sends an input signal to the microprocessor through the signal input terminal; the microprocessor is configured to determine whether functions of the electronic apparatus are normal or not to obtain a second judgment value according to the input signal;
   wherein the microprocessor is configured to control whether the power supply unit supplies the driving power to the electronic apparatus or not according to the first judgment value and the second judgment value;
   wherein the signal isolation unit receives the input signal and then the signal isolation unit informs the microprocessor of the input signal in isolation to protect the microprocessor.

2. The multifunctional signal isolation converter in claim 1, wherein the signal isolation unit is an electromagnetic signal isolator, a capacitive signal isolator or an inductive signal isolator.

3. The multifunctional signal isolation converter in claim 1, further comprising:
   a voltage-limiting current-limiting circuit electrically connected to the microprocessor, the signal input terminal, the signal isolation unit, the power supply unit and the electronic apparatus,
   wherein the voltage-limiting current-limiting circuit comprises:
   at least a zener diode; and
   a current-limiting resistor electrically connected to the zener diode.

4. The multifunctional signal isolation converter in claim 3, further comprising:
   a signal output circuit electrically connected to the microprocessor,
   wherein the microprocessor outputs an output signal through the signal output circuit.

5. The multifunctional signal isolation converter in claim 4, further comprising:
   a communication module electrically connected to the microprocessor.

6. The multifunctional signal isolation converter in claim 5, further comprising:
   an amplifying circuit electrically connected to the microprocessor and the signal output circuit.

7. The multifunctional signal isolation converter in claim 6, wherein the internal functions of the multifunctional signal isolation converter determined by the microprocessor comprise: whether an internal voltage of the multifunctional signal isolation converter is complied with a standard voltage or not, whether communications between the microprocessor and internal components of the multifunctional signal isolation converter are normal or not, and whether an internal temperature of the multifunctional signal isolation converter is complied with a standard temperature or not.

8. The multifunctional signal isolation converter in claim 7, wherein the functions of the electronic apparatus determined by the microprocessor comprise: whether a current of the input signal is greater than zero or not, and whether the current of the input signal is complied with a standard current or not.

9. The multifunctional signal isolation converter in claim 8, wherein the microprocessor comprises an analog-to-digital conversion unit; the analog-to-digital conversion unit converts the input signal into a digital signal; the first judgment value and the second judgment value are digital signal values; the microprocessor is configured to control the power supply unit not to send the driving power to the electronic apparatus when the first judgment value is not "1" or the second judgment value is not "1"; the microprocessor is configured to control the power supply unit to send the driving power to the electronic apparatus when the first judgment value is "1" and the second judgment value is "1"; the microprocessor further comprises a look-up table; the microprocessor is configured to check the look-up table to control whether the power supply unit supplies the driving power to the electronic apparatus or not.

* * * * *